United States Patent
Takeuchi et al.

[11] Patent Number: 5,955,392
[45] Date of Patent: Sep. 21, 1999

[54] ZIRCONIA CERAMIC GREEN SHEET

[75] Inventors: Yukihisa Takeuchi, Nishikamo-gun; Tsutomu Nanataki, Toyoake; Hisanori Yamamoto, Nagoya; Takahiro Maeda, Ichinomiya, all of Japan

[73] Assignee: NGK Insulators, Ltd., Nagoya, Japan

[21] Appl. No.: 08/858,264

[22] Filed: May 19, 1997

Related U.S. Application Data

[63] Continuation of application No. 08/550,997, Oct. 31, 1995, abandoned.

[30] Foreign Application Priority Data

Nov. 9, 1994 [JP] Japan .................................. 6-275038

[51] Int. Cl.$^6$ .................................................. C04B 35/486
[52] U.S. Cl. ............................................ 501/103; 501/104
[58] Field of Search ................................. 501/127, 103, 501/104

[56] References Cited

U.S. PATENT DOCUMENTS

| | | | |
|---|---|---|---|
| 3,740,243 | 6/1973 | Kappes et al. | 106/65 |
| 4,009,238 | 2/1977 | Niedermeier et al. | 264/61 |
| 4,159,295 | 6/1979 | Mazzuchelli et al. | 264/63 |
| 4,624,808 | 11/1986 | Lange | 264/23 |
| 4,678,762 | 7/1987 | Agarwal et al. | 501/127 |
| 5,057,360 | 10/1991 | Osaka et al. | 501/103 |
| 5,248,712 | 9/1993 | Takeuchi et al. | 524/56 |
| 5,292,693 | 3/1994 | Kaga et al. | 501/103 |
| 5,517,076 | 5/1996 | Takeuchi et al. | 310/358 |
| 5,733,499 | 3/1998 | Takeuchi et al. | 264/650 |

FOREIGN PATENT DOCUMENTS

| | | |
|---|---|---|
| 0 615 964 A2 | 9/1994 | European Pat. Off. . |
| 2 143 069 | 2/1973 | France . |
| 2 394 506 | 1/1979 | France . |
| 55-134991 | 10/1980 | Japan . |
| 2-273558 | 11/1990 | Japan . |
| 3-106983 | 5/1991 | Japan . |
| 4-280875 | 10/1992 | Japan . |
| 5-115713 | 5/1993 | Japan . |
| 5-220718 | 8/1993 | Japan . |
| 6-91620 | 4/1994 | Japan . |
| 7 403 842 | 10/1974 | Netherlands . |
| 2 230 339 | 1/1973 | United Kingdom . |
| 2 111 038 | 6/1983 | United Kingdom . |

*Primary Examiner*—Karl Group
*Attorney, Agent, or Firm*—Kubovcik & Kubovcik

[57] ABSTRACT

A ceramic green sheet includes ceramic particles having a spherical diameter of 0.01–0.5 $\mu$m of a primary particle as a ceramic component, an average degree of aggregation of 10 or less, wherein the ceramic green sheet contains at most 1 vol % of secondary particles having a diameter of 20 $\mu$m or more and has a surface roughness (Ra) of 0.2 $\mu$m or less. A method for producing a ceramic substrate having a thickness of 30 $\mu$m or less includes the steps of: preparing a ceramic slurry by mixing a ceramic powder with an organic binder and at least one organic solvent, and adjusting a viscosity to be within the range of 100–10,000 mPa.s; removing coarse aggregated particles from the ceramic slurry; molding the ceramic slurry into a ceramic green sheet by a reverse roll coater method; and firing the ceramic green sheet so that an average crystal grain size be 2 $\mu$m or less.

2 Claims, 3 Drawing Sheets

(THE ARROW SHOWS A FLOW OF A CERAMIC SLURRY)

SURFACE TYPE

DEPTH TYPE

ZIRCONIA CERAMIC GREEN SHEET

This application is a continuation of application Ser. No. 08/550,999 filed Oct. 31, 1995, now abandoned.

BACKGROUND OF THE INVENTION AND RELATED ART STATEMENT

The present invention relates to a ceramic green sheet and a method for producing a ceramic substrate. The ceramic substrate is thin and hardly has surface defects, and it is used as a substrate for an electric circuit, a substrate for a multilayer circuit, a diaphragm, an elastic plate, etc.

Japanese Patent Laid-Open 55-134991 discloses a method for producing a thin ceramic green sheet or substrate. In the method, a ceramic powder, an organic binder, an organic solvent and the like are mixed together so as to obtain a ceramic slurry. As shown in FIG. 6, the slurry 10 is subjected to filtering by a mesh net 60 in a filter container 50 using a suction bottle 70 and a vacuum tube 80 so as to remove aggregates or the like in the ceramic slurry and produce a filtered slurry 90.

There has recently been a demand for a particularly thin ceramic substrate or ceramic green sheet having a thickness of, for example, at most 30 $\mu$m. However, suitable properties of ceramic particles constituting such a ceramic substrate or a green sheet has been unknown. Upon this, attention has been paid to the size of the ceramic particles so as to make the particles finer or the like using the conventional technique for ceramics. However, it has been difficult to make a product which hardly has surface defects, and many products had to be disposed of as defective goods.

A ceramic slurry is prepared by mixing a ceramic powder with an organic binder and an organic solvent. Usually, the ceramic slurry inevitably contains coarse aggregated particles, dry coagulated grains, reaggregates, fine air bubbles, etc, besides impurities. The coarse aggregated particles and the like are imminent as defects in a ceramic green sheet and a ceramic substrate made from such a slurry. When the ceramic substrate is thin, such defects are prone to be actualized as a deterioration in the surface smoothness or the strength, occurrence of cracks, a deterioration in the dimensional stability, the electric insulation, the airtightness, etc. When a reverse roll coater method is employed, molding is conducted by a transferring process. Therefore, if the aforementioned coarse aggregated particles or the like are present in a ceramic slurry, a ceramic green sheet gains fatal defects on the surface. There has been a manufacturing problem of improving, particularly, a thin ceramic substrate having a thickness of at most 30 $\mu$m, which is used as a substrate for an electric circuit, a substrate for multilayer circuit, a diaphragm, an elastic plate, etc.

Japanese Patent Laid-Open 55-134991 disclosed a method for removing coarse aggregated particles and the like, in which a net of 100–500 mesh is used for filtering a slurry. However, even a net of 500 mesh (25 $\mu$m between each wire) cannot remove the coarse aggregated particles or the like of 25 $\mu$m or less. To make the finer mesh is very difficult, and it causes clogging for a short period of time. Therefore, such a fine mesh was not put to practical use at all. Further, there are some other problems in the aforementioned method, i.e., because suction filtering is employed, an organic solvent in the ceramic slurry is prone to evaporate, which causes occurrence of undesirable air bubbles and partially causes occurrence of coagulated dry substance.

SUMMARY OF THE INVENTION

The object of the presently invention is for solving the aforementioned problems.

The first aspect of the present invention provides a ceramic green sheet comprising ceramic particles having a spherical diameter of 0.01–0.5 $\mu$m of a primary particle as a ceramic component, an average degree of aggregation of 10 or less, wherein said ceramic green sheet contains 1 vol % or less of secondary particles having a diameter of 20 $\mu$m or more and has a surface roughness (Ra) of 0.2 $\mu$m or less.

A ceramic green sheet of the present invention may be formed of a material having, as a main component of the ceramic particle, a partially stabilized zirconia, completely stabilized zirconia, alumina, or a mixture thereof, or a material which becomes one of these component after firing.

The second aspect of the present invention provides a method for producing a ceramic substrate having a thickness of 30 $\mu$m or less, comprising the steps of: preparing a ceramic slurry by mixing a ceramic powder with an organic binder and an organic solvent, and adjusting a viscosity to be within the range of 100 –10,000 mPa.s; removing coarse aggregated particles from the ceramic slurry; molding the ceramic slurry into a ceramic green sheet by a reverse roll coater method; and firing the ceramic green sheet so that an average crystal grain size is 2 $\mu$m or less.

Preferably, the ceramic slurry is put under pressure and filtered using a depth type filter having an average port diameter of 100 $\mu$m or less so as to remove coarse aggregated particles.

In a suitable step for removing coarse aggregated particles, the ceramic slurry is preferably subjected to acceleration of at least 100 m/s$^2$ so as to separate coarse aggregated particles.

The ceramic powder preferably has a spherical diameter of 0.01–0.5 $\mu$m of a primary particle and an average degree of aggregation of 10 or less.

Here, the spherical diameter is a diameter of a sphere obtained by converting a value of a specific surface area (m$^2$/g) of a ceramic particle, and it is expressed by 6/$\rho$S ($\mu$m). In addition. $\rho$ denotes a theoretical density (g/cm$^3$) of a ceramic particle, and S denotes a specific surface area (m$^2$/g) of a ceramic particle measured by BET method.

The aforementioned average degree of aggregation can be obtained by dividing a value of the median of the diameter of secondary particles measured by a laser scattering method by the aforementioned spherical diameter of a primary particle. In this case, a sample to be supplied for the measurement of a particle diameter by the laser scattering method was obtained by weight 30 ml of 0.2% solution of sodium hexametaphosphoric acid and 50 mg of a ceramic powder, putting them in a container, and dispersing them by a homogenizer (ultrasonic oscillator) for one minute. Incidentally, as an instrument for the measurement, there was used LA-700, which is a commercial product made by HORIBA, LTD.

A sample for measuring a spherical diameter of a primary particle of a ceramic green sheet and a average degree of aggregation was obtained by subjecting the ceramic green sheet to heat treatment in which a heating temperature was slowly raised and the sheet was heated at the highest temperature of 350° C. as shown in the profile in FIG. 5 under an oxidized atmosphere, thereby sufficiently decomposing and removing binders and the like. Thus, the powdered ceramic was obtained and measured in the same manner as described above. A rate of volume of secondary particles denotes a rate of total volume of particles each having a particle diameter of 20 $\mu$m or more, which was measured by a laser scattering method.

A depth type filter in the aforementioned method is desirably a porous ceramic filter or porous resin filter. An average pore diameter of the filter was measured by mercury press-fitting method.

Suitable organic binders are (1) poly(vinyl butyral), (2) ethyl cellulos, (3) polyester acrylate such as polyethylacrylate, polybutylacrylate, and the like, (4) polyester methacrylate such as polymethylmethacrylate, polybutylmethacrylate, and the like. However, any organic binder which is soluble in an organic solvent can be used.

The viscosity was measured using a LVT type of viscometer manufactured by Brook Field, Ltd. The conditions of the measurement were No. 3 rotor, the number of rotation of 12 rpm, a temperature of the sample ceramic slurry of 25° C.

Incidentally, a primary particle means an individual ceramic particle, and a secondary particle means a granule of aggregated primary particles.

DETAILED DESCRIPTION OF THE INVENTION

Figure 1:
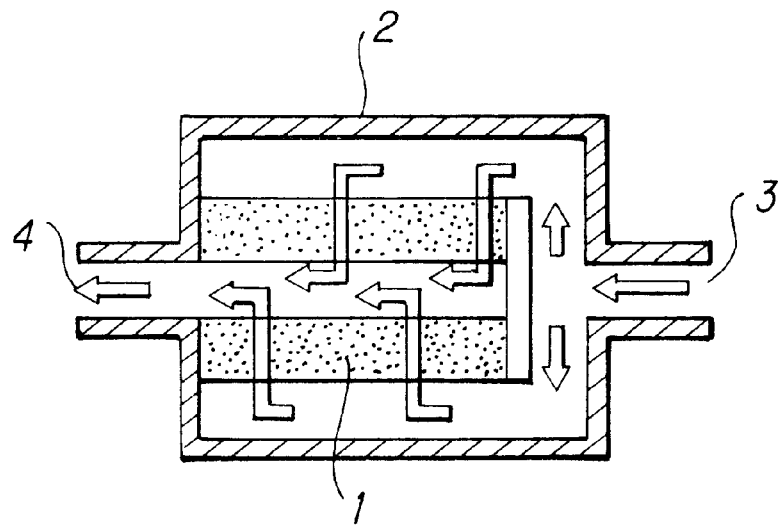
FIG. 1 is a typical cross-sectional view of a filtering portion of a cylindrical depth filtering apparatus.

A ceramic green sheet contains ceramic particles, as a ceramic component, having a spherical diameter of 0.01–0.5 $\mu$m of a primary particle and an average degree of aggregation of 10 or less. By specifying the spherical diameter of a primary particle and an average degree of aggregation to be in certain ranges, the ceramic green sheet becomes suitable to produce a ceramic substrate having a thin thickness.

A spherical diameter of the primary particle is preferably within the range of 0.05–0.3 $\mu$m, more preferably 0.1–0.2 $\mu$m. When the spherical diameter is too large, it makes higher a firing temperature for producing a ceramic substrate or causes deterioration of a surface smoothness or strength of a ceramic substrate because crystal grains coarsely grow. When the spherical diameter is too small, mutual aggregating force among ceramic particles becomes strong and ceramic particles hardly disperse evenly. Thus, a ceramic green sheet having an even thickness cannot be obtained since a slurry suitable for molding cannot be obtained. Further, a coarse aggregated particle is prone to be formed, and drying shrinkage becomes uneven when a sheet is formed of a slurry, which is prone to cause a deformation and cracks. In addition, the dimensional stability after firing deteriorates because a coarse aggregated particle has a large difference in firing shrinkage rate in comparison with the other points.

The present invention is characterized in that an average degree of aggregation of ceramic particles is controlled. The average degree of aggregation is 10 or less, preferably 7 or less, more preferably 5 or less. When the average degree of aggregation is too high, a ceramic green sheet has an uneven thickness, deformation, cracks. Further, dimensional stability of a ceramic substrate deteriorates and a surface roughness becomes coarse when a ceramic substrate is produced. Thus, a material having such a condition is not suitable for producing a ceramic substrate having a thin thickness.

Further, a particle having a high average degree of aggregation is prone to cause not only a defect on the surface of a ceramic substrate but also a defect such as a scratch. Therefore, in the present invention, secondary particles each having a particle diameter of 20 $\mu$m or more should be 1 vol % or less. Desirably, a secondary particle having a particle diameter of preferably 10 $\mu$m or more, more preferably 5 $\mu$m or more, is 1 vol % or less.

A ceramic particle of the present invention may be a partially stabilized zirconia, a completely stabilized zirconia, alumina, spinel, mullite, silicon nitride, aluminum nitride, silicon carbide, titania, beryllia, or a material having a mixture of these as a main component. Particularly, a partially stabilized zirconia, a completely stabilized zirconia, alumina, or a material having a mixture of these as a main component is desirable. Among them, a material having a partially stabilized zirconia as a main component is more preferable. The zirconia is partially stabilized by adding a compound such as yttrium oxide to zirconia to make a tetragonal crystal or a mixed crystal mainly consisting of at least two crystal phases selected from cubic crystal, tetragonal crystal, and monoclinic crystal. Here, a partially stabilized zirconia means a zirconium oxide (zirconia) which crystal phase is partially stabilized so that crystal phase is transformed only partially when subjected to heat or stress. Incidentally, the aforementioned material may contain a sintering aid up to 30 wt %, for example, clay, silica, magnesia, a transition metal oxide, or the like.

Further, it is also necessary that a ceramic green sheet of the present invention has a surface roughness Ra of 0.2 $\mu$m or less, preferably 0.15 $\mu$m or less, more preferably 0.10 $\mu$m or less. The surface roughness Ra was measured by a surface roughness gauge of Surfcom 470A manufactured by Tokyo Seimitsu Co,. Ltd. Ra is an average of values of center line mean roughness obtained at 3 points under the conditions that a configuration of a tip diamond is conical of 5 $\mu$mR 90°, a cut off value is 0.80 mm, a tracing speed is 0.30 mm/s, and a length of measurement is 2.5 mm.

In the method for producing a ceramic substrate according to the present invention, the aforementioned ceramic powder is mixed with an organic binder and an organic solvent so as to prepare a ceramic slurry. The ceramic slurry has desirably a viscosity of 100–10000 mPa.s, more preferably 500–2000 mPa.s. The reason is that too high viscosity makes the removal of coarse aggregated particles difficult in the next step. For example, a high viscosity is prone to cause clogging when the slurry is filtered by a depth type filter, and a filtering efficiency decreases. In addition, in a step of separating coarse aggregated particles by acceleration, a moving speed of a coarse aggregated particle decreases, and therefore, an efficiency in separating coarse aggregated particles decreases. On the other hand, when the viscosity is too low, it becomes difficult to form a green sheet, and evenness of the ceramic slurry deteriorates.

Figure 3:
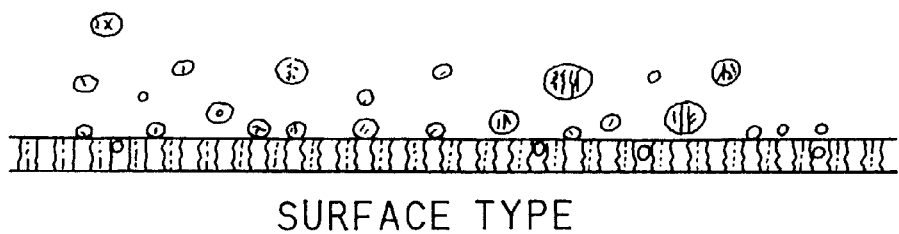
FIG. 3 is typical views of a surface filter and a depth filter.
Figure 3:
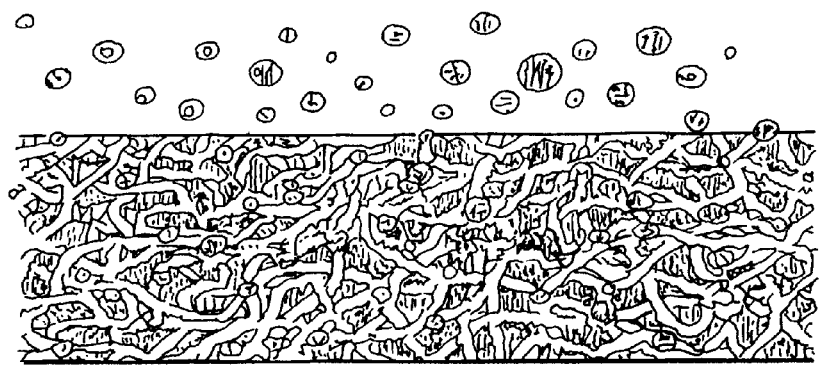

Filters can be classified into two kinds of a surface type and a depth type as shown in FIG. 3 depending on the structure of the media. A filter of a surface type is represented by a screen mesh constituted by stainless wires or the like and has a short media through which a slurry passes. This type of filter determines the size of particles which can be removed depending on a distance of each wire. Filtering small things having a small particle diameter as in the technical field of the present invention is prone to cause clogging, and the filter cannot be put to practical use.

On the other hand, filtering by a filter of a depth type is called depth filtering or volume filtering. The filter has a thickness to some degree. A suitable embodiment for the method of the present invention uses the filter of a depth type so as to remove coarse aggregated particles. The embodiment is hereinbelow described with reference to FIGS. 1 and 2.

A ceramic slurry which viscosity is adjusted is pressurized so as to be filtered in order to remove coarse aggregated particles in the ceramic slurry according to the flow shown in FIG. 1 by a filter 1 of a depth type of, for example, a porous ceramic filter or a porous resin filter. The filter apparatus shown in FIG. 1 includes a chamber 2, a slurry supply inlet 3, an outlet 4 for the separated slurry and the filter 1. The filter 1 has an average pore diameter of 100 $\mu$m or less, desirably 50 $\mu$m or less, more desirably 30 $\mu$m or less. The filter 1 for the present invention desirably has a thickness (d) of 5 mm or more. However, the thickness of the filter may be determined depending on the size of coarse particles to be filtered, the strength of the filter itself, etc. The pressure applied to the slurry is desirably within the range of 0.1–5.0 Kg/cm$^2$. If the pressure is too low, filtering of the ceramic slurry takes too much time. If the pressure is too high, pores of a filter are prone to be enlarged, the filter is prone to have breakage, or a particle having a larger diameter than a predetermined diameter is prone to pass through the filter. The ceramic slurry may be subjected to removal of bubbles under reduced pressure before and after filtering.

In an embodiment of a method of the present invention, a depth type filter is used because it was found that the filter hardly caused clogging regardless of ability to remove rather smaller particles than a particle having an average pore diameter and gave high filtering efficiency. The reason why the filter hardly has clogging seems that pores of the filtering layer are complexly connected with each other between the front surface, and the back surface, and a layer of slurry which is comparatively soft and which adsorbs inside pores blocks the flow of coarse aggregated particles.

Figure 4:
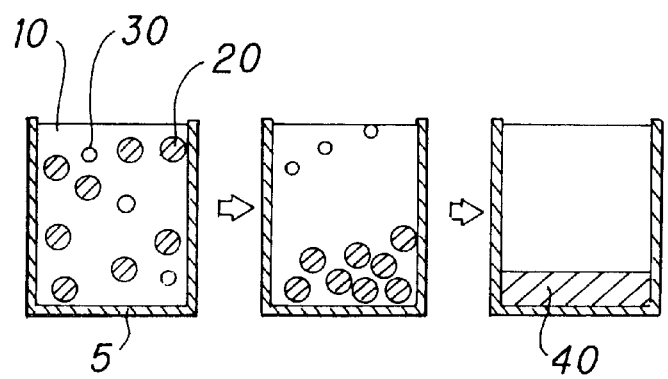
FIG. 4 is a explanatory view of a centrifugal separating treatment.
Figure 5:
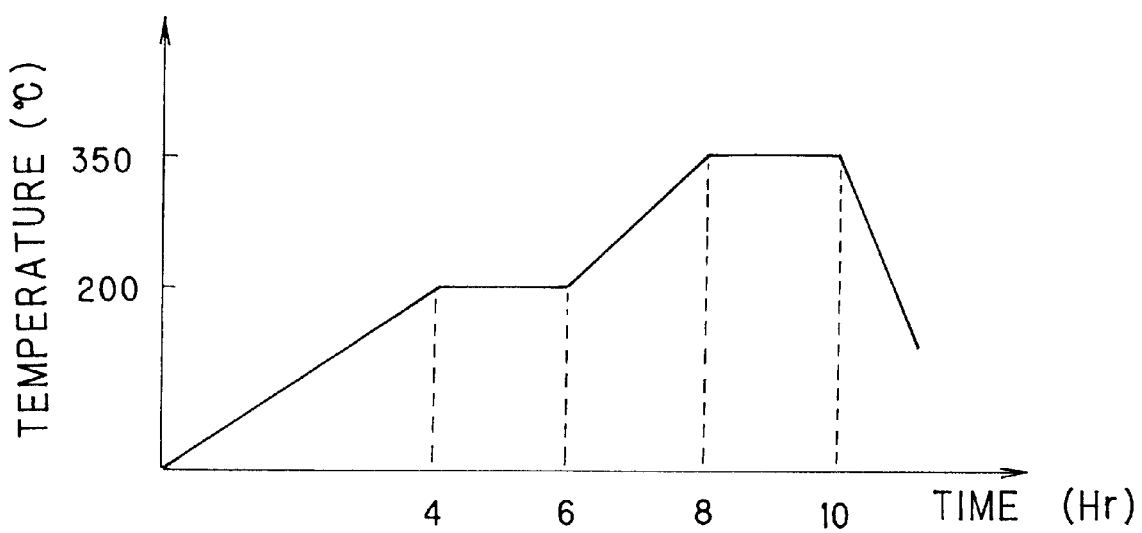
FIG. 5 is a profile for powdering a ceramic green sheet.
Figure 6:
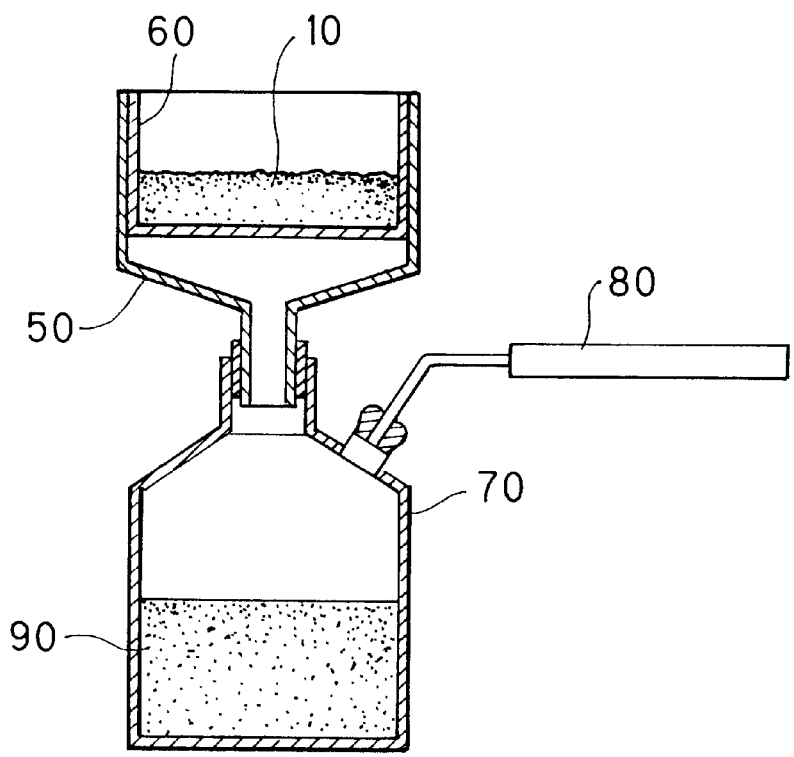
FIG. 6 is a conventional filtering apparatus using a surface filter.

As a step of removing coarse aggregated particles of the present invention, there is recommended another embodiment i.e., a step of separating coarse particles by applying an acceleration of at least 100 m/s$^2$ to the ceramic slurry. For example, an acceleration of 100 m/s$^2$ is applied by centrifugation treatment as shown in FIG. 4. In FIG. 4, a slurry 10 containing aggregated particles 20 and bubbles 30 is subjected to centrifugation in container 5. The resultant slurry sediment is designated 40 in FIG. 4. By subjecting a ceramic slurry put in a container to centrifugation treatment, aggregates or coarse aggregated particles such as a dried substance in the ceramic slurry sediment, adhere, and can be separated. In this case, the acceleration may be 100 m/s$^2$ or more, desirably 1000 m/s$^2$ or more, more desirably 5000 m/s$^2$ or more. Further, centrifugation method can separate coarse aggregated particles regardless of an average degree of aggregation, while filtering using ceramic particles having an average aggregated degree of 10 or more sometimes causes clogging because of coarse aggregated particles and has difficulty in separating such particles. Incidentally, a ceramic powder to be used preferably has a spherical diameter of 0.01–0.5 $\mu$m of a primary particle, and an average degree of aggregation of 10 or less because a proportion of ceramic particles to a composition of organic compound changes when a rate of sedimentation and adhesion increases.

Then, in a step of molding a ceramic slurry into a ceramic green sheet of the present invention, a reverse roll coater method is employed. A doctor blade method, which is widely used as a method for molding a sheet, does not provide a thin green sheet having an even thickness. A trace of being scratched off remains on the surface as vertical lines, which cause deterioration of the strength or the surface smoothness. Therefore, a molding by a reverse roll coater method is necessarily employed so as to obtain a sheet scarcely having surface defects.

Then, the aforementioned ceramic green sheet may be laminated with other green sheets and fired simultaneously or independently fired depending on use under conditions suitable for removing a binder, sintering, or the like as similar to the conventional method. In this case, it is necessary to fire the material so as to obtain a sintered body having an average crystal grain size of 2 $\mu$m or less of a ceramic component. In the range in which an average crystal grain size is 2 $\mu$m or less, a surface roughness Ra is preferably 0.30 $\mu$m or less, more preferably 0.20 $\mu$m or less. It is because a method for producing a ceramic substrate having thin thickness as in the present invention needs to be able to produce a ceramic substrate scarcely having surface defects and being excellent in surface smoothness. Incidentally, after a cross-section of the ceramic substrate was subjected to abrasion and mirror plane finishing, a grain boundary was exhibited by thermal etching according to a known method so as to calculate an average crystal grain size $D(\mu m) = \sqrt{(4S/\pi n)}$ by measuring for the number n of grains and the area $S(\mu m^2)$ by an electron microscope.

The aforementioned surface roughness Ra was obtained by the surface roughness gauge used for the measurement for the green sheet, and Ra is an average of values of center line mean roughness at 3 points under the conditions that a configuration of a tip diamond is conical of 5 $\mu$mR 90°, a cut off value is 0.80 mm, a tracing speed is 0.30 mm/s, and a length of measurement is 2.5 mm.

In the present invention, as an organic binder and an organic solvent, which are used, and a placticizer and a dispersant, which may be used for improving properties of a ceramic green sheet, the following binders, etc., are recommended. Suitable organic binders are poly(vinyl butyral), polyester methacrylate, ethyl cellulose, etc. However, any binder which is soluble in an organic solvent can be used. At least one organic solvent may be an alcohol such as methyl alcohol, ethylalcohol, isopropyl alcohol, n-butyl alcohol, or the like, an aromatic hydrocarbon such as benzene, toluene, xylene, or the like, a ketone, such as methyl ethyl ketone, methyl isobutyl ketone, acetone, a general organic solvent such as trichloroethylene, tetrachloroethylene, or the like, or a mixed solvent thereof. A plasticizer may be a general plasticizer such as an ester phthalate, an ester sebacate, and an ethylene glycol. A dispersant may be a general dispersant such as a sorbitic fatty acid ester or a surface active agent.

A ceramic substrate of the present invention has a relative density of generally 90% or more, preferably 95% or more, more preferably 98% or more in view of material properties such as strength, Young's modulus, or the like.

A ceramic green sheet and a method for producing a ceramic substrate according to the present invention can be suitably applied to (1) a multilayer ceramic substrate, (2) an IC substrate, (3) a solid electrolyte for a fuel cell, (4) a diaphragm plate or an elastic plate such as various kinds of sensors, an actuator, a transmitter, an oscillator, a display, a microphone, a speaker, filter, and the like. Means of application for the aforementioned used are not only independently using the ceramic green sheet but also printing of the ceramic green sheet and laminating the sheets to be multilayered. When used as a diaphragm plate or an elastic plate, a ceramic green sheet is laminated on another ceramic green sheet, which is used as a substrate, so as to form a passive element, or an active element.

(EXAMPLES)

Then, the present invention is hereinbelow described in more detail with reference to Examples.

(Example 1)

Figure 2:
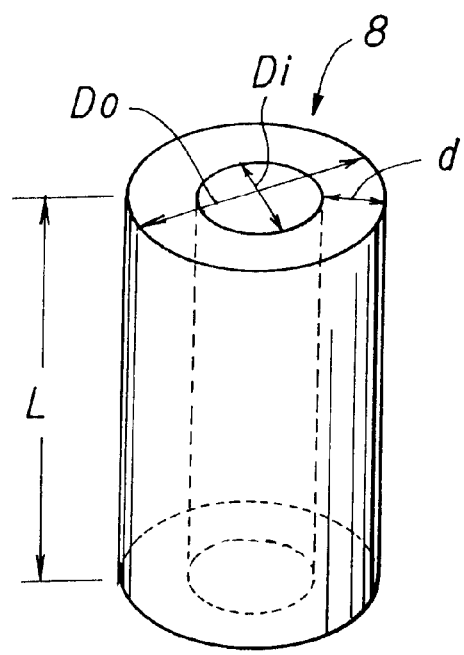
FIG. 2 is a perspective view of a media of a cylindrical depth filter.

There was prepared a ceramic powder having the spherical diameter and the average degree of aggregation shown in Tables 1 and 2. A partially stabilized zirconia of 100 weight parts containing yttrium oxide of 3 mol % as a ceramic powder was mixed with dioctyl phthalate of 4.5 weight parts as a plasticizer and sorbitic fatty acid ester of 2 weight parts as a dispersant, and toluene of 20 weight parts and isopropyl alcohol of 30 weight parts as solvents in an alumina pot together with zirconia balls for 5 hours so as to be subjected to ball mill mixing. Then, there were added as an organic binder solution poly(vinyl butyral) resin of 9 weight parts, toluene of 10 weight parts, isopropyl alcohol of 10 weight parts to the mixture in the alumina pot so as to being subjected to ball mill mixing for 30 hours. At this time, a viscosity of the ceramic slurry was adjusted to be 1500 mPa.s. The slurry was filtered by a resin cylindrical filter 8 as shown in FIG. 2 (thickness d of 20 mm, outer diameter $D_o$ of 70 mm, inner diameter $D_i$ of 30 mm, width L of filter of 250 mm) under a pressure of 1 Kg/cm². The thus obtained ceramic slurry was subjected to reverse roll coater so as to obtain a ceramic green sheet having a thickness of about 10 $\mu$m. FIG. 1 shows a typical cross-sectional view of a filtering portion of a cylindrical depth filter used here. Incidentally, the ceramic powder was obtained by calcining, grinding by ball mill, and heat treating a material obtained by coprecipitation method. A spherical diameter of a primary particle can be made larger as the calcining temperature becomes higher, and varied depending on conditions in the aforementioned coprecipitaing conditions, for example, pH, temperature, concentration, etc. Further, the spherical diameter can be varied depending on conditions in the ball mill grinding step and in the step of heat treatment. An average degree of aggregation can be varied depending on treating conditions in the aforementioned ball mill grinding step or in the heat treating step. The thus obtained ceramic green sheet was fired at a predetermined temperature in the air so as to obtain a ceramic substrate having a thickness of 7 $\mu$m.

A surface roughness Ra of the ceramic green sheet was measured. Further, the ceramic green sheet was calcined at 350° C. so as to obtain a ceramic powder. A spherical diameter, an average degree of aggregation, and a volume rate of a secondary powder ($\geq$20 $\mu$m) of the obtained ceramic powder were measured. The results are shown in Table 1.

The number of defects larger than 10 $\mu$m which were present on the surface of the ceramic substrate after firing (observed by a microscope), a surface roughness Ra of the ceramic substrate, and an average grain size are shown in Table 2.

TABLE 1

Example 1 (1)

| | Ceramic powder | | Ra of green sheet ($\mu$m) | Powder obtained by calcining a green sheet at 350° C. | | |
|---|---|---|---|---|---|---|
| Sample No. | Spherical diameter ($\mu$m) | Average degree of aggregation | | Spherical diameter ($\mu$m) | Average degree of aggregation | Volume rate of secondary particles each having a diameter of 20 $\mu$m or more (%) |
| 1 | 0.01 | 10 | 0.15 | 0.01 | 10 | 0.9 |
| 2 | 0.05 | 7 | 0.10 | 0.05 | 7 | |
| 3 | 0.15 | | | 0.15 | | 0.0 |
| 4 | | 10 | 0.16 | | 10 | |
| 5 | | 20 | | Slurry did not pass through. * | | |
| 6 | | 3 | 0.08 | 0.15 | 3 | 0.0 |
| 7 | | | | | | |
| 8 | | | 0.10 | | | |
| 9 | 0.30 | 5 | | 0.30 | 5 | |
| 10 | 0.50 | | 0.15 | 0.50 | | |

* Comparative Example

TABLE 2

Example 1 (2)

| | Treatment: | | | | Ceramic substrate | | |
|---|---|---|---|---|---|---|---|
| Sample No. | Spherical diameter ($\mu$m) | Average degree of aggregation | Average pore diameter ($\mu$m) | Firing Temperature (° C.) × 2 hrs. | Number of defects (cm$^{-2}$) | Ra ($\mu$m) | Average Crystal grain size ($\mu$m) |
| 1 | 0.01 | 10 | 30 | 1350 | 40 | 0.20 | 0.1 |
| 2 | 0.05 | 7 | | 1400 | 20 | 0.16 | 0.3 |
| 3 | 0.15 | 7 | | 1450 | | 0.18 | 0.4 |
| 4 | | 10 | | | 30 | 0.26 | |

TABLE 2-continued

Example 1 (2)

| Sample No. | Treatment: Spherical diameter (μm) | Average degree of aggregation | Average pore diameter (μm) | Firing Temperature (° C.) × 2 hrs. | Ceramic substrate Number of defects (cm⁻²) | Ra (μm) | Average Crystal grain size (μm) |
|---|---|---|---|---|---|---|---|
| 5 |  | 20 |  | Slurry did not pass through. * |  |  |  |
| 6 |  | 3 | 20 | 1450 | 3 | 0.20 | 0.4 |
| 7 |  |  | 30 |  | 6 |  |  |
| 8 |  |  | 70 |  | 50 | 0.22 |  |
| 9 | 0.30 | 5 | 30 | 1550 | 15 | 0.24 | 0.9 |
| 10 | 0.50 |  |  | 1650 | 30 | 0.30 | 1.5 |

* Comparative Example (Example 2)

A partially stabilized zirconia powder of 100 weight parts containing yttrium oxide of 3 mol % as a ceramic material was mixed with a dioctyl phthalate of 4.5 weight parts as a plasticizer, and sorbitic fatty acid ester of 2 weight parts as a dispersant, toluene of 20 weight parts, and isopropyl alcohol of 30 weight parts as solvents in an alumina pot with zirconia balls for 5 hours. Then, poly(vinyl butyral) resin of 9 weight parts, toluene of 10 weight parts, and isopropyl alcohol of 10 weight parts were added to the aforementioned mixture in the alumina pot so as to subject the mixture to ball mill mixing for 30 hours. At this time, the viscosity of the ceramic slurry was adjusted to be 1500 mPa.s. Then, the slurry was put in a glass container with a lid and subjected to a treatment using a centrifugal separator for 30 minutes. Then, a ceramic green sheet having a thickness of about 10 μm was formed by a reverse roll coater method. The thus obtained ceramic green sheet was fired at a predetermined temperature in the air so as to obtain a ceramic substrate having a thickness of 7 μm. The results are shown in Tables 3 and 4. The method for evaluation was the same as Example 1.

TABLE 3

Example 2 (1)

| Sample No. | Ceramic powder Spherical diameter (μm) | Average degree of aggregation | Ra of green sheet (μm) | Powder obtained by calcining a green sheet at 350° C. Spherical diameter (μm) | Average degree of aggregation | Volume rate of secondary particles having a diameter of 20 μm or more (%) |
|---|---|---|---|---|---|---|
| 11 | 0.01 | 10 | 0.14 | 0.01 | 10 | 0.6 |
| 12 | 0.05 | 7 | 0.10 | 0.05 | 7 | 0.0 |
| 13 | 0.15 | 20 | 0.15 | 0.15 | 20 | 0.8 |
| 14 |  | 10 | 0.14 |  | 10 | 0.0 |
| 15 |  | 3 | 0.05 |  | 3 |  |
| 16 |  |  | 0.06 |  |  |  |
| 17 |  |  | 0.08 |  |  |  |
| 18 |  |  | 0.10 |  |  |  |
| 19 | 0.30 | 5 |  | 0.30 | 5 |  |
| 20 | 0.50 |  | 0.15 | 0.50 |  |  |

TABLE 4

Example 2 (2)

| Sample No. | Spherical diameter (μm) | Average degree of aggregation | Treatment: Acceleration of centrifugal separation (m/s²) | Firing Temperature (° C.) × 2 hrs | Ceramic subtrate | | |
|---|---|---|---|---|---|---|---|
| | | | | | Number of defects (cm⁻²) | Ra (μm) | Average crystal grain size (μm) |
| 11 | 0.01 | 10 | 6000 | 1350 | 20 | 0.20 | 0.1 |
| 12 | 0.05 | 7 | | 1400 | 10 | 0.18 | 0.3 |
| 13 | 0.15 | 20 | | 1450 | 40 | 0.22 | 0.4 |
| 14 | | 10 | | | 15 | 0.20 | |
| 15 | | 3 | 20000 | | 0 | 0.15 | |
| 16 | | | 6000 | | 1 | 0.18 | |
| 17 | | | 1000 | | 6 | 0.20 | |
| 18 | | | 100 | | 50 | | |
| 19 | 0.30 | 5 | 6000 | 1550 | 8 | 0.25 | 0.9 |
| 20 | 0.50 | | | 1650 | 20 | 0.30 | 1.5 |

(Comparative Example 1)

A partially stabilized zirconia powder of 100 weight parts containing yttrium oxide of 3 mol % as a ceramic material was mixed with dioctyl phthalate of 4.5 weight parts as a plasticizer, and sorbitic fatty acid ester as a main component of 2 weight parts as a dispersant, toluene of 20 weight parts, and isopropyl alcohol of 30 weight parts as solvents in an alumina pot with zirconia balls for 5 hours. Then, poly(vinyl butyral) resin of 9 weight parts, toluene of 10 weight parts, and isopropyl alcohol of 10 weight parts were added to the aforementioned mixture in the alumina pot so as to subject the mixture to ball mill mixing for 30 hours. At this time, a viscosity of the ceramic slurry was adjusted to be 1500 mPa.s. Then, the slurry was filtered by a stainless screen of 325 mesh (distance between each wire is 44 μm). A ceramic green sheet having a thickness of about 10 μm was formed by a reverse roll coater. The thus obtained ceramic green sheet was fired at a predetermined temperature in the air so as to obtain a ceramic substrate having a thickness of 7 μm. The results are shown in Tables 5 and 6. A method for the evaluation was the same as Example 1.

TABLE 5

Comparative Example 1 (1)

| Sample No. | Ceramic powder | | Ra of green sheet (μm) | Powder obtained by calcining a green sheet at 350° C. | | Volume rate of secondary particles having a diameter of 20 μm or more (%) |
|---|---|---|---|---|---|---|
| | Spherical diameter (μm) | Average degree of aggregation | | Spherical diameter (μm) | Average degree of aggregation | |
| 27 | 0.01 | 10 | 0.55 | 0.01 | 10 | 3.0 |
| 28 | 0.05 | 7 | 0.40 | 0.05 | 7 | 1.5 |
| 29 | 0.15 | 10 | 0.50 | 0.15 | 10 | 2.2 |
| 30 | | 20 | 1.50 | | 20 | 4.5 |

TABLE 6

Comparative Example 1 (2)

| Sample No. | Spherical diameter (μm) | Average degree of aggregation | Treatment: Screen mesh | Firing Temperature (° C.) × 2 hrs. | Ceramic substrate | | |
|---|---|---|---|---|---|---|---|
| | | | | | Number of defects (cm⁻²) | Ra (μm) | Average Crystal grain size (μm) |
| 27 | 0.01 | 10 | 325 mesh | 1350 | 900 | 0.70 | 0.1 |
| 28 | 0.05 | 7 | | 1400 | 200 | 0.55 | 0.3 |
| 29 | 0.15 | 10 | | 1450 | 500 | 0.75 | 0.4 |
| 30 | | 20 | | | >1000 | 1.80 | |

(Example 3)

A ceramic green sheet and a ceramic substrate were prepared in the same manner as in Example 1 except for the following conditions. Incidentally, an average pore diameter of a resin cylindrical filter was 30 μm. Three kinds of ceramic powders, i.e., (1) a completely stabilized zirconia powder (Sample No. 23 in Tables 7 and 8), (2) alumina powder (Sample No. 21), and (3) a partially stabilized zirconia powder of 90 weight parts and alumina powder of 10 weight parts (Sample No. 22) were used. The results are shown in Tables 7 and 8. A method for the evaluation was the same as Example 1.

TABLE 7

Example 3 (1)

| | Ceramic powder | | Ra of green sheet (μm) | Powder obtained by calcining a green sheet at 350° C. | | |
|---|---|---|---|---|---|---|
| Sample No. | Spherical diameter (μm) | Average degree of aggregation | | Spherical diameter (μm) | Average degree of aggregation | Volume rate of secondary particles having a diameter of 20 μm or more (%) |
| 21 | 0.10 | 2 | 0.06 | 0.10 | 2 | 0.0 |
| 22 | 0.14 | 3 | 0.08 | 0.14 | 3 | |
| 23 | 0.20 | 5 | 0.10 | 0.20 | 5 | |

TABLE 8

Example 3 (2)

| | Treatment: | | | | Ceramic substrate | | |
|---|---|---|---|---|---|---|---|
| Sample No. | Spherical diameter (μm) | Average degree of aggregation | Average pore diameter (μm) | Firing Temperature (° C.) × 2 hrs. | Number of defects (cm$^{-2}$) | Ra (μm) | Average Crystal grain size (μm) |
| 21 | 0.10 | 2 | 30 | 1400 | 2 | 0.16 | 0.3 |
| 22 | 0.14 | 3 | | | 5 | 0.20 | 0.4 |
| 23 | 0.20 | 5 | | 1450 | 10 | | 0.5 |

(Example 4)

A ceramic green sheet and a ceramic substrate were prepared in the same manner as in Example 2 except for the following conditions. Incidentally, an acceleration by centrifugal separation was 6000 m/s$^2$. Three kinds of ceramic powders, i.e., (1) a completely stabilized zirconia powder (Sample No. 26 in Tables 9 and 10), (2) alumina powder (Sample No. 24), and (3) a partially stabilized zirconia powder of 90 weight parts and alumina powder of 10 weight parts (Sample No. 25) were used. The results are shown in Tables 9 and 10. A method for the evaluation was the same as Example 1.

TABLE 9

Example 4 (1)

| | Ceramic powder | | Ra of green sheet (μm) | Powder obtained by calcining a green sheet at 350° C. | | |
|---|---|---|---|---|---|---|
| Sample No. | Spherical diameter (μm) | Average degree of aggregation | | Spherical diameter (μm) | Average degree of aggregation | Volume rate of secondary particles having a diameter of 20 μm or more (%) |
| 24 | 0.10 | 2 | 0.06 | 0.10 | 2 | 0.0 |
| 25 | 0.14 | 3 | 0.08 | 0.14 | 3 | |
| 26 | 0.20 | 5 | | 0.20 | 5 | |

TABLE 10

Example 4 (2)

| Sample No. | Spherical diameter (μm) | Average degree of aggregation | Treatment: Acceleration of centrifugal separation (m/s²) | Firing Temperature (° C.) × 2 hrs | Ceramic substrate | | |
|---|---|---|---|---|---|---|---|
| | | | | | Number of defects (cm⁻²) | Ra (μm) | Average crystal grain size (μm) |
| 24 | 0.10 | 2 | 6000 | 1400 | 0 | 0.17 | 0.3 |
| 25 | 0.14 | 3 | | | 1 | 0.20 | 0.4 |
| 26 | 0.20 | 5 | | 1500 | 6 | | 0.5 |

As described above, the first aspect of the present invention provides a ceramic green sheet which hardly has surface defects, has high surface smoothness, and has a thin thickness by controlling a spherical diameter and an average degree of aggregation of ceramic particles.

The second aspect of the present invention provides a method for producing a ceramic substrate. In the method, a spherical diameter and an average degree of aggregation of ceramic particles are controlled, and coarse aggregated particles are removed in a ceramic slurry, which gives a thin ceramic substrate scarcely having surface defects and having surface smoothness.

What is claimed is:

1. A ceramic green sheet comprising zirconia particles and an organic binder, said zirconia particles having a spherical diameter of 0.1–0.2 μm of a primary particle and an average degree of aggregation of 10 or less and said organic binder being at least one member selected from the group consisting of poly(vinyl butyral), ethyl cellulose, polyester acrylate and polyester methacrylate, wherein said ceramic green sheet contains 1 vol % or less of secondary particles having a diameter of 20 μm or more and has a surface roughness (Ra) of 0.2 μm or less and a thickness such that a ceramic substrate produced by firing the green sheet has a thickness of 30 μm or less.

2. A ceramic green according to claim 1, wherein said zirconia is a partially stabilized zirconia or a completely stabilized zirconia, or a material which becomes one of these components after firing.

* * * * *